(12) United States Patent
You et al.

(10) Patent No.: US 7,602,245 B2
(45) Date of Patent: Oct. 13, 2009

(54) METHOD, APPARATUS AND SYSTEM FOR REDUCING DC COUPLING CAPACITANCE AT SWITCHING AMPLIFIER

(75) Inventors: Seung-Bin You, Seongnam-si (KR); Yong-Jin Cho, Inchoen (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 46 days.

(21) Appl. No.: 11/889,419

(22) Filed: Aug. 13, 2007

(65) Prior Publication Data

US 2008/0088371 A1    Apr. 17, 2008

(30) Foreign Application Priority Data

Aug. 23, 2006   (KR) ...................... 10-2006-0079793

(51) Int. Cl.
*H03F 3/217*    (2006.01)
(52) U.S. Cl. ...................... 330/251; 330/10; 330/207 A
(58) Field of Classification Search .................. 330/10, 330/251, 207 A
See application file for complete search history.

(56) References Cited

U.S. PATENT DOCUMENTS 7,116,168 B2 * 10/2006 Makino et al. .............. 330/251
7,161,421 B2 *  1/2007 Honda ......................... 330/10

FOREIGN PATENT DOCUMENTS

| JP | 2004-242240 | 8/2004 |
|---|---|---|
| JP | 2005-159871 | 6/2005 |
| KR | 1020050032292 A | 4/2005 |
| KR | 2006-0011934 | 2/2006 |
| WO | WO 2006/031304 | 3/2006 |
| WO | WO 2006/031304 A2 | 3/2006 |
| WO | WO 2006/059956 | 6/2006 |

OTHER PUBLICATIONS

UK Search Report dated Dec. 6, 2007.

* cited by examiner

*Primary Examiner*—Robert Pascal
*Assistant Examiner*—Hieu P Nguyen
(74) *Attorney, Agent, or Firm*—Harness, Dickey & Pierce

(57) ABSTRACT

A digital amplifier, a reference voltage generator for reducing a DC component of an amplified pulse width modulated signal of a digital amplifier, and a method of reducing a DC component of an amplified pulse width modulated signal applied to an input node of a load are described in this disclosure. The digital amplifier includes a pulse width modulation signal generator receiving an input signal and generating an amplified pulse width modulated signal, a filter filtering the amplified pulse width modulated signal and providing the filtered amplified pulse width modulated signal to an input node of a load, and a reference voltage generator providing a reference voltage to a reference node of the load to reduce a DC component of the filtered amplified pulse width modulated signal provided to the input node of the load.

17 Claims, 9 Drawing Sheets

000
METHOD, APPARATUS AND SYSTEM FOR REDUCING DC COUPLING CAPACITANCE AT SWITCHING AMPLIFIER

PRIORITY STATEMENT

This application claims priority of Korean Patent Application No. 2006-79793, filed on Aug. 23, 2006, in the Korean Intellectual Property Office, the entire contents of which is incorporated herein by reference.

BACKGROUND

1. Field of the Invention

Example embodiments relate to an amplifier and method of reproducing sound. In particular, example embodiments relate to a digital amplifier and a method of reproducing sound in which a reference voltage related to an analog DC component of an output node is provided to a reference node.

2. Description of the Related Art

Various conventional amplifiers have been used to amplify audio signals. These conventional amplifiers include class-A, class-B, class-AB and class-D amplifiers. Generally, class-D amplifiers have superior power efficiency characteristics as compared with the class-A, class-B and class-AB amplifiers.

Class-D amplifiers are commonly used in portable devices at least in part because of an increased emphasis that is generally placed on the size and weight of portable devices. For example, headphones associated with various portable audio players include class-D amplifiers.

FIG. 1 is a basic block diagram illustrating a conventional class-D amplifier 100, and FIGS. 2A-E illustrate a simplified example of the signal processing performed by each of the components of the class-D amplifier 100. The operation of the conventional class-D amplifier 100 is explained below referring to FIGS. 1 and 2A-E.

The class-D amplifier 100 includes a Pulse Width Modulation (PWM) signal generator 10, a class-D driving circuit 20, a low pass filter 30 and a coupling capacitor C2. FIG. 2A illustrates the PWM signal generator 10 receives a first signal 13 and a second signal 11. The first signal 13 is shown in FIG. 2A as a square wave. For example, the first signal 13 may be received from an internal or external clock. The second signal 11 received by the class-D amplifier 100 is referred to hereinafter as an audio input signal 11. In order to simplify the explanation, the received audio input signal 11 is illustrated in FIG. 2A as a sinusoidal wave. The PWM signal generator 10 processes the first signal 13 and the audio signal 11 and outputs a PWM signal 15 to the class-D driving circuit 20. The PWM signal 15 is shown in FIG. 2B, and the duty cycle of the PWM signal 15 is varied according to the received audio signal 11. The class-D driving circuit 20 amplifies the PWM signal 15 and provides the amplified signal 25 shown in FIG. 2C to the low pass filter 30. The low pass filter 30 averages the amplified signal 25, thereby reducing high frequency noise, and provides the filtered signal 31 to the coupling capacitor C2. The coupling capacitor C2 removes the DC voltage from the filtered signal 31 and outputs an output signal 33. In FIG. 1, the output signal 33 is provided to a speaker 150, which has a resistance RL that is connected to the class-D amplifier 100. The speaker 150 is a speaker, for example, included in headphones for a portable audio device.

As described above, a conventional class-D amplifier 100 includes the coupling capacitor C2 for removing the DC voltage from the filtered signal 31. Further, the coupling capacitor C2 is used prevent high currents from flowing through the headphones and having the headphones be in a continuously on state. If the resistance RL of the speaker 150 is about 16-32 ohms, which is typical, the capacitance value of the coupling capacitor C2 is typically within a range of 100-470 μF. However, the physical size of a 100-470 μF coupling capacitor is prohibitively large and thus, inhibits the miniaturization of the conventional class-D amplifier 100 including one or more coupling capacitors.

As such, other conventional amplifiers have been developed that do not use and/or require the coupling capacitor. FIG. 3 is a block diagram of a prior art amplifier 200 disclosed in International Publication No. WO 2006/031304, which does not include a coupling capacitor.

Referring to FIG. 3, the prior art amplifier 200 includes a first amplifier 21 driving a speaker of a left headphone, a second amplifier 22 driving a speaker of a right headphone, and a DC voltage-to-voltage converter 40. The first amplifier 21 is connected to a headphone load RL via a connecting lead 51, and the second amplifier 22 is connected to a headphone load RL via a connecting lead 52. Each of the first amplifier 21, the second amplifier 22, and the DC voltage-to-voltage converter 40 receive a supply voltage VDD. The DC voltage-to-voltage converter 40 is a "charge pump" and converter uses charge pump circuitry including capacitors or inductors to store and transfer energy. The DC voltage-to-voltage converter 40 is used instead of coupling capacitors, which would be located in series between the output of the first amplifier 21 and the speaker of the left headphone and the output of the second amplifier 22 and the speaker of the right headphone.

The charge pump circuitry of the prior art amplifier shown in FIG. 3 generates a negative voltage rail −VDD with respect to ground. The negative voltage rail −VDD provided by the charge pump circuitry powers the first amplifier 21 and the second amplifier 22, and drives amplifier operation from both positive and negative rails. Providing a negative voltage rail −VDD with respect to ground allows for the headphone amplifiers to be biased at a ground voltage, thereby allowing the incoming signals to be amplified without clipping.

As such, the prior art headphone amplifier circuit 200 allows for the headphone speakers represented by RL to be biased at zero volts, operating between VDD and −VDD, which in turn allows for the lead 51 of the first amplifier 21 and the lead 52 of the second amplifier 22 to be directly coupled to the headphone speakers RL, without the need for any DC coupling capacitors.

Because the DC voltage-to-voltage converter 40 is a capacitive or inductive charge pump, meaning the charge pump circuitry includes capacitors or inductors to store and transfer energy, charge and discharge are needed to artificially generate the negative voltage rail −VDD from the supply voltage VDD. The charge and discharge operations of the DC voltage-to-voltage converter 40 significantly increase power consumption of the headphone amplifier circuit 200 as compared to a conventional amplifying circuit including the coupling capacitors, such as the conventional class-D amplifier 100.

SUMMARY

Example embodiments are directed to a digital amplifier, a reference voltage generator for reducing a DC component of an amplified pulse width modulated signal of a digital amplifier, and a method of reducing a DC component of an amplified pulse width modulated signal applied to an input node of a load.

An example embodiment provides a digital amplifier. The digital amplifier may include a pulse width modulation signal generator receiving an input signal and generating an amplified pulse width modulated signal; a filter filtering the amplified pulse width modulated signal and providing the filtered amplified pulse width modulated signal to an input node of a load; and a reference voltage generator providing a reference voltage to a reference node of the load to reduce a DC component of the filtered amplified pulse width modulated signal. According to this example embodiment, the reference voltage is substantially equal to one half of a sum of a maximum voltage value and a minimum voltage value of the filtered amplified pulse width modulated signal.

Another example embodiment of a digital amplifier includes a pulse width modulation circuit receiving an input signal and providing a pulse width modulated signal corresponding to the input signal; a filter filtering the pulse width modulated signal and providing the filtered pulse modulated signal directly to an input node of a load; and a reference voltage generator providing a reference voltage directly to a reference node of the load to reduce a DC component of the filtered pulse width modulation signal.

Further, an example embodiment of a digital amplifier includes a pulse width modulation signal generator receiving an input signal and generating an amplified pulse width modulated signal; a filter filtering the amplified pulse width modulated signal and providing the filtered amplified pulse width modulated signal to an input node of a load; and a reference voltage generator providing a reference voltage that is substantially constant and greater than zero to a reference node of the load to reduce a DC component of the amplified pulse modulation signal provided to the input node of the load.

Another example embodiment of a digital amplifier includes a pulse width modulation signal generator receiving an input signal and generating an amplified pulse width modulated signal; a filter filtering the amplified pulse width modulated signal and providing the filtered amplified pulse width modulated signal to an input node of a load; and a reference voltage generator providing a reference voltage to a reference node of the load to reduce a DC component of the filtered amplified pulse width modulated signal, the reference voltage corresponding to an average voltage of the filtered amplified pulse width modulated signal.

Still another example embodiment provides a reference voltage generator for reducing a DC component of an amplified pulse width modulated signal of a digital amplifier. The reference voltage generator includes a voltage divider receiving a voltage and dividing the voltage to provide a voltage divider voltage that is based on variation of the amplified pulse width modulated signal provided to an input node of a load; and an analog buffer buffering the voltage divider voltage to provide a reference voltage to a reference node of the load to reduce a DC component of the amplified pulse width modulated signal provided to the input node of the load.

Another example embodiment provides a method of reducing a DC component of an amplified pulse width modulated signal applied to an input node of a load. The method includes generating a reference voltage that is substantially equal to one half of a sum of a maximum voltage value and a minimum voltage value of the amplified pulse width modulated signal; and providing the reference voltage to a reference node of the load to reduce a DC component of the pulse width modulated signal.

BRIEF DESCRIPTION OF THE DRAWINGS

The above and other aspects and advantages of the present invention will become more apparent by describing in detail example embodiments thereof with reference to the attached drawings in which.

DETAILED DESCRIPTION OF EXAMPLE EMBODIMENT

Various example embodiments are now described more fully with reference to the accompanying drawings in which some example embodiments of the invention are shown. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present invention.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present. Other words used to describe the relationship between components should be interpreted in a similar manner (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, unless the context clearly indicates otherwise.

Now, in order to more specifically describe example embodiments various embodiments are described in detail with reference to the attached drawings.

Figure 4:
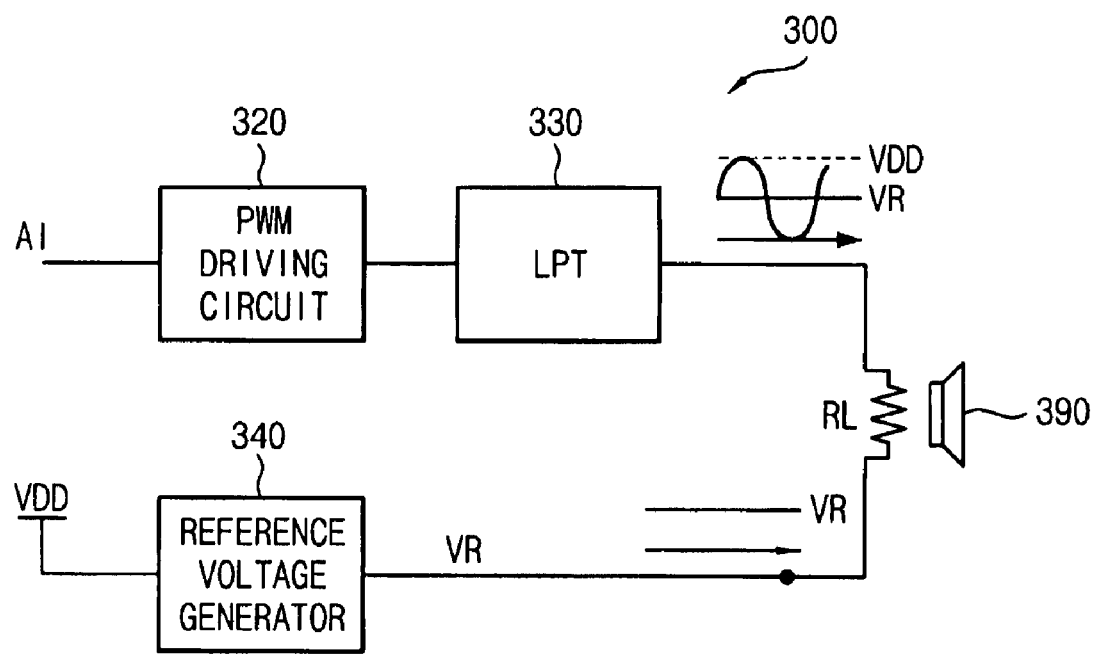
FIG. 4 is a block diagram of an example embodiment of an amplifier circuit including a PWM driving circuit, a filter and a reference voltage generator.

Referring to FIG. 4, an example embodiment of an amplifier circuit 300 includes a PWM driving circuit 320, a low-pass filter 330 and a reference voltage generator 340. The amplifier circuit 300 provides an output signal to an output node NA and a reference signal to a reference node NB. As shown in FIG. 4, one or more speakers 390 may be connected between the output node NA and the reference node NB. As such the output node NA of the amplifier circuit 300 is the input node of the one or more speakers 390 having a load RL.

The PWM driving circuit 320 may be a class-D driving circuit. The PWM driving circuit 320 pulse width modulates and amplifies an input signal and outputs an amplified PWM signal representing the input signal. The input signal may be an audio input signal AI.

The amplified PWM signal is then provided to the low pass filter 330. The low pass filter 330 averages the amplified PWM signal reducing high frequency components of the signal such as noise, and outputs a filtered signal via the output node NA.

The reference voltage generator 340 generates a reference voltage VR from a supply voltage VDD. For example, the reference voltage generator 340 generates a reference voltage VR having a voltage value between a high (e.g., maximum) voltage value of the output signal and a low (e.g., minimum) voltage value of the output signal; the output signal being the filtered signal provided to an input of the speaker 390 via the output node NA. The value of the reference voltage VR generated by the reference voltage generator 340 may be substantially constant. According to an example embodiment, the reference voltage VR is set as a predetermined value. The predetermined value may correspond to a median value between a high voltage value and a low voltage value of the output signal. For example, if the high voltage value of the output signal is about 5 volts and the low voltage value of the output signal is about 0 volts, the predetermined value is set to about 2.5 volts. An example configuration of the reference voltage generator 340 is described in greater detail below with reference to FIGS. 6-8.

Still referring to FIG. 4, the amplifier circuit 300 is connected to one or more speakers 390 having a resistance RL. The speakers may be headphone speakers for a portable audio device. In particular, the output signal of the low pass filter 330 is provided to a first input of the one or more speakers via the output node NA, i.e., the input node of the one or more speakers 390, and the reference signal generated by the reference voltage generator 340 is provided to a second input of the one or more speakers via the reference node NB.

Figure 1:
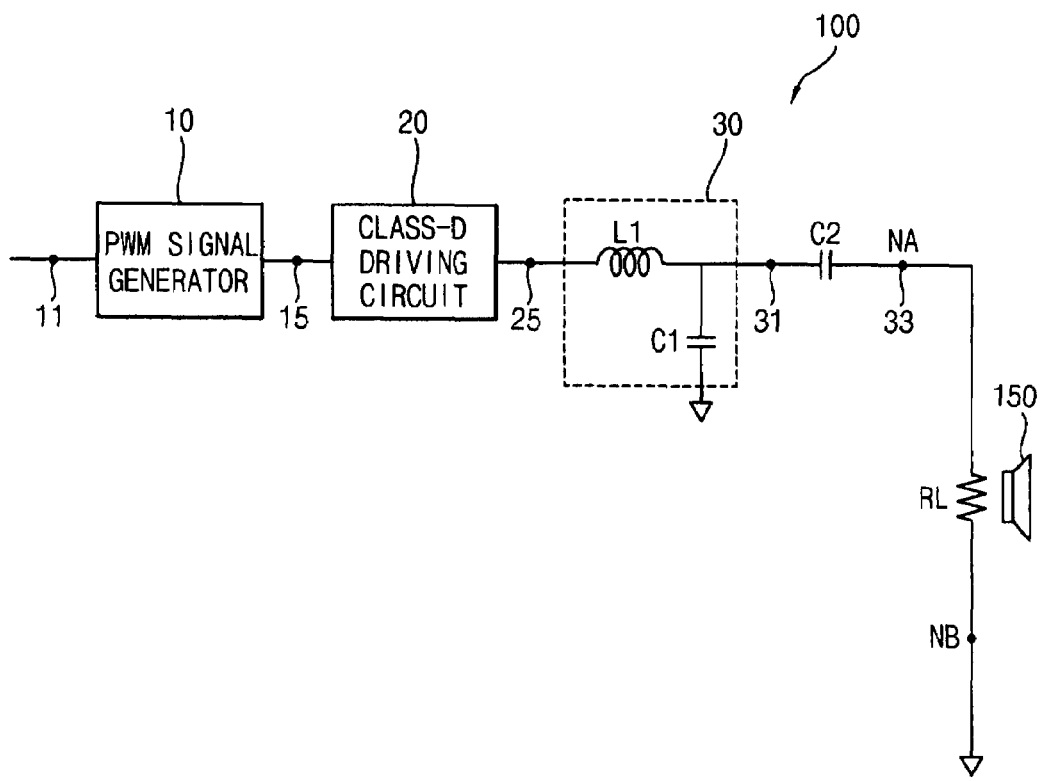
FIG. 1 is a basic block diagram illustrating a conventional class-D amplifier.
Figure 2:
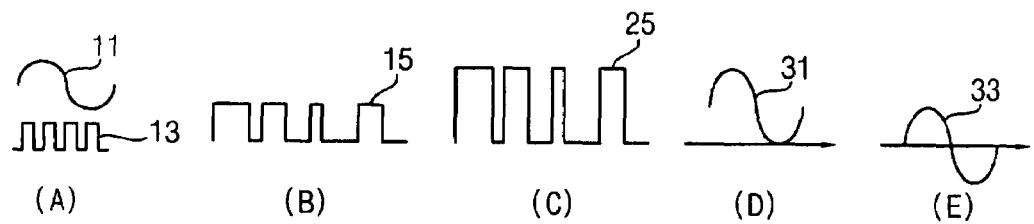
FIGS. 2A-E illustrate a simplified example of the signal processing performed by each of the components of the conventional class-D amplifier illustrated in FIG. 1.
Figure 3:
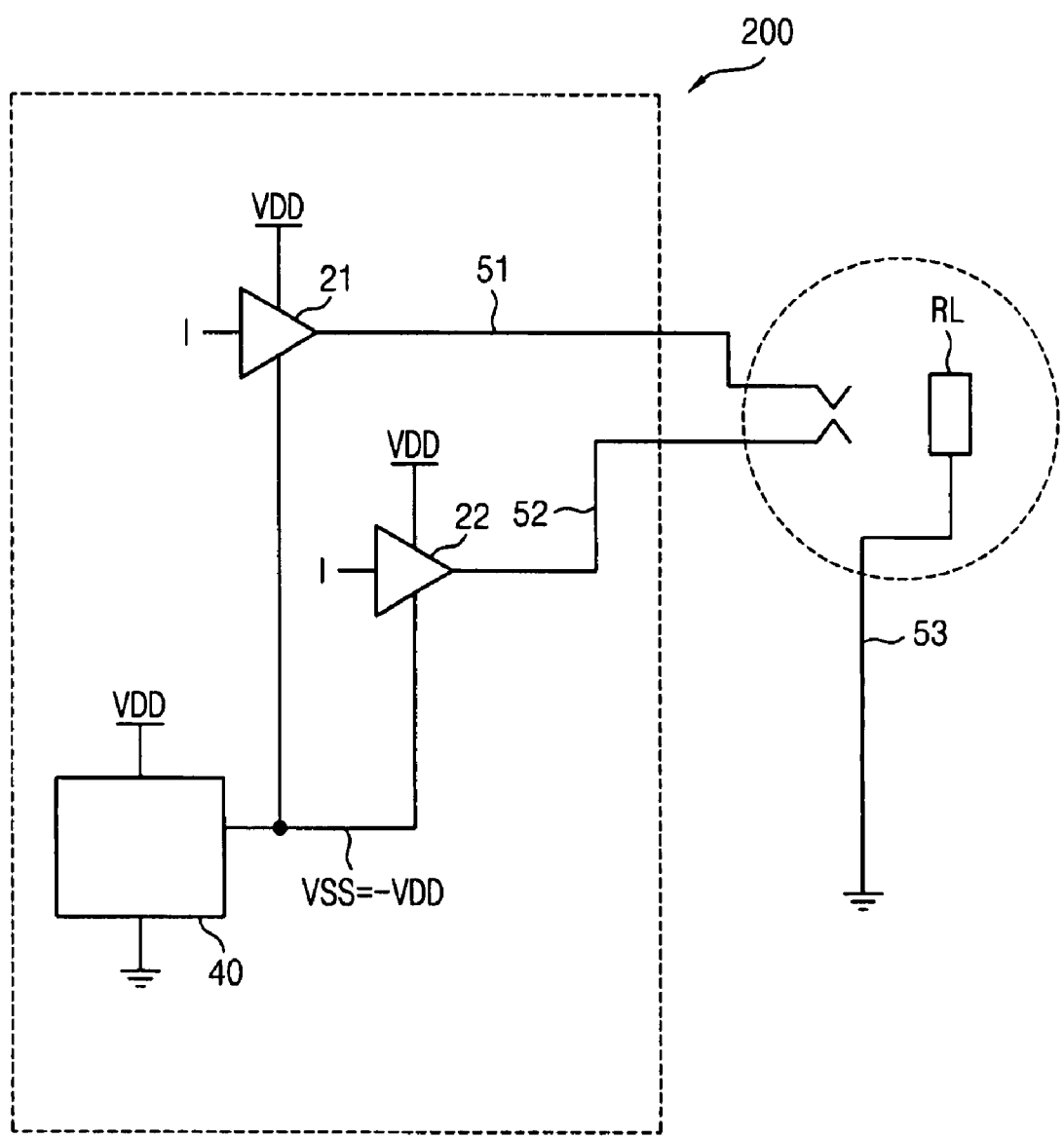
FIG. 3 is a block diagram of a prior art amplifier disclosed in International Publication No. WO 2006/031304.

As shown in FIG. 4, an example embodiment of an amplifier circuit 300 does not include coupling capacitors connected in series between the amplifier circuit 300 and the load RL attached to the amplifier circuit 300. For example, there is no coupling capacitor between the output of the low pass filter 330 and the one or more speakers 390 having the load RL. Stated differently, the filtered, amplified pulse width modulated signal is provided directly from the low pass filter 330 to the one or more speakers 390 having the load RL. As such, the chip area of the amplifier circuit 300 is reduced as compared with the chip area required for the conventional amplifier 100 shown in FIG. 1, which includes at least one coupling capacitor. Still further, according to an example embodiment, the amplifier circuit 300 includes a reference voltage generator 330 instead of a charge pump. As such, the power consumption of the amplifier circuit 300 is reduced as compared with the prior art headphone amplifier circuit 200 shown in FIG. 3.

Figure 5:
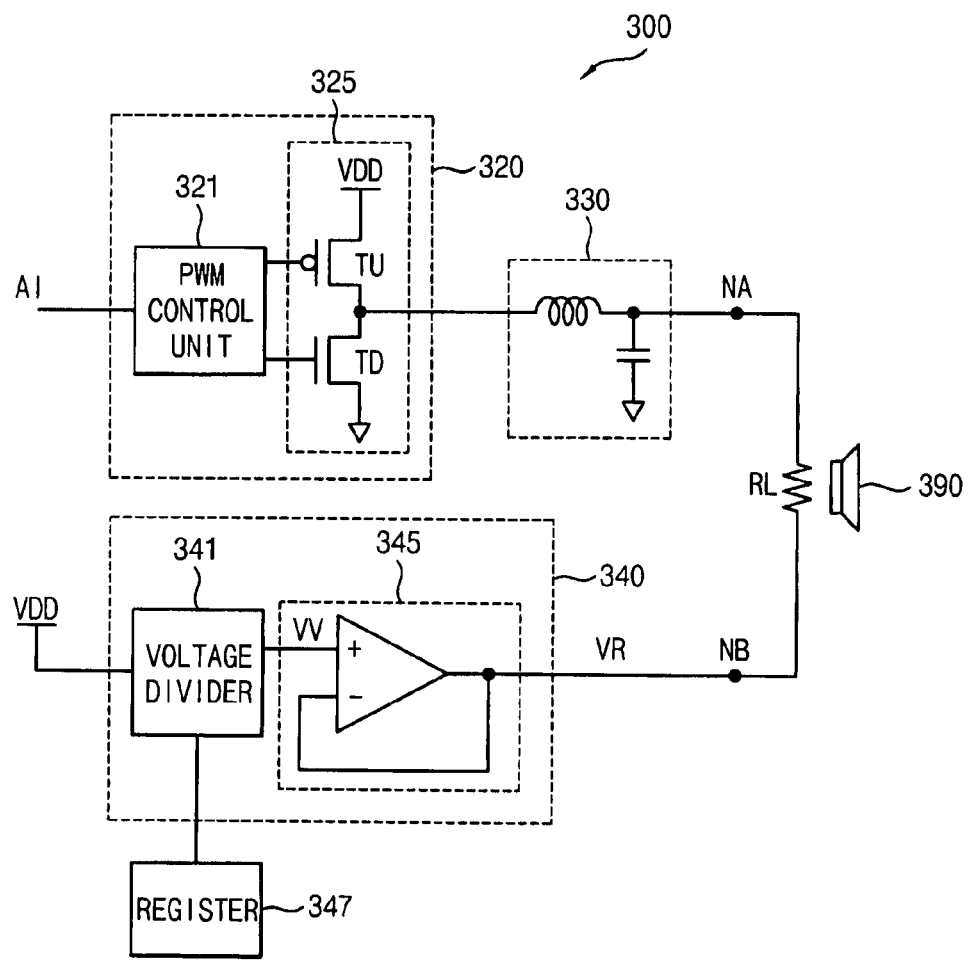
FIG. 5 illustrates an example embodiment of an amplifier circuit and an example configuration of each of a PWM driving circuit, a filter and a reference voltage generator included in the amplifier circuit.

FIG. 5 illustrates an example embodiment of an amplifier circuit 300 and an example configuration of each of the PWM driving circuit 320, the low-pass filter 330 and the reference voltage generator 340.

Referring to FIG. 5, the PWM driving circuit 320 includes a PWM control circuit 321 and a switching amplifier 325. The PWM control circuit 321 pulse width modulates a received audio input signal AI and outputs a PWM signal, via a first output and second output, to the switching amplifier 325. The example configuration of the switching amplifier 325 shown in FIG. 5 includes a PMOS transistor TU and an NMOS transistor TD connected in series between a supply voltage VDD and ground. In particular, the source of the PMOS transistor TU is connected to the supply voltage VDD; the gate of the PMOS transistor TU is connected to a first output signal of the PWM control circuit 321; and the drain of the PMOS transistor TU is connected to an input of the low-pass filter 330 and the source of the NMOS transistor TD. The drain of the NMOS transistor TD is connected to the input of the low-pass filter 330 and the drain of the PMOS transistor TU; the gate of the NMOS transistor TD is connected to the second output of the PWM control unit 321; and the source of the NMOS transistor TD is grounded. As such, the transistors of the switching amplifier 325 are driven by the PWM signal provided by the PWM control unit 321, thereby providing an amplified PWM signal.

The low-pass filter 330 shown in FIG. 5 includes an inductor and a capacitor. As previously discussed, the low-pass filter 330 averages the amplified PWM signal reducing high frequency components of the signal such as noise, and outputs an output signal to the output node NA. Specific configurations and operations of low-pass filters are well-known in the art and thus, will not be further discussed herein for the sake of brevity.

FIG. 5 further illustrates an example embodiment of a reference voltage generator 340. The example configuration of the reference voltage generator 340 shown in FIG. 5 includes a voltage divider 341 and an analog buffer 345 (also referred to as a unit gain amplifier or voltage follower). The voltage divider 341 generates a voltage divider voltage VV from the supply voltage VDD. The analog buffer 345 operates to stabilize the voltage divider voltage VV and provide the reference voltage VR. The analog buffer 345 receives the voltage divider voltage VV from the voltage divider 341, stabilizes the voltage divider voltage VV and provides the stabilized voltage divider voltage to the output node NB. The stabilized voltage divider voltage is referred to hereinafter as the reference voltage VR. The analog buffer 345 includes an operational amplifier and stabilizes the voltage divider voltage VV to provide the reference voltage VR by feeding back the buffered voltage divider voltage to an inverting input of the operation amplifier.

FIG. 5 also indicates that the voltage divider 341 of the reference voltage generator 340 is connected to a register 347 according to one example embodiment. Information stored in the register 347 may be used to control the value of the voltage divider voltage VV provided by the voltage divider 341.

Figure 6:
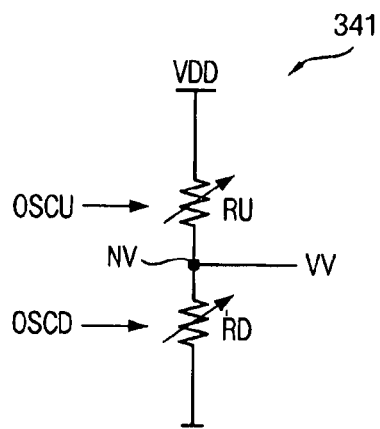
FIG. 6 illustrates an example embodiment of the voltage divider, which may be included in the reference voltage generator of an amplifier circuit.

FIG. 6 illustrates an example configuration of the voltage divider 341. Referring to FIG. 6, the voltage divider 341 includes a first variable resistor RU and a second variable resistor RD connected in series between a supply voltage VDD and ground. The first variable resistor RU and the second variable resistor RD are connected via a voltage divider node NV of the voltage divider 341, and a voltage divider voltage VV at the voltage divider node NV is provided to the analog buffer 345. A resistance value of the first variable resistor RU is controlled based on a first control signal OSCU, and a resistance value of the second variable resistor RD is controlled based on a second control signal OSCD. Each of the first control signal OSCU and second control signal OSCD may be based on information stored in the register 347 or based on a comparison result between the output node NA and the reference node NB at an initialization time of the amplifier circuit 300 as explained in greater detail below. The voltage divider voltage VV of the voltage divider 341 is calculated as shown below in equation 1.

$$VV = \frac{RD}{RU + RD} \times VDD \quad (1)$$

As previously indicated, according to one example embodiment the first control signal OSCU and the second control signal OSCD may be controlled based on information stored in the register 347. As such, the voltage divider voltage VV is controlled based on the information stored in the register 347. For example, the information stored in the register 347 may be a user input predetermined voltage value, information associated with the load RL of the one or more speakers 390, a table indicating the relationship between the first and second control signals OSCU and OSCD and resistance values of the first and second variable resistors RU and RD, specifications including manufacturing tolerances of the actual components of the amplifier circuit 300, etc.

For example, if the supply voltage VDD is about 5.0 volts and the resistance values of the first variable resistor RU and the second variable resistor RD are both approximately 1 kohms, equation 1 would provide a voltage divider voltage VV of approximately 2.5 volts. However, due to manufacturing tolerances, etc., the actual components in the voltage divider may vary and thus, information stored in the register 347 controlling the first control signal OSCU and the second control signal OSCD may be used to further control the voltage divider voltage VV output by the voltage divider 341. As previously indicated, the voltage divider voltage VV is then stabilized by the analog buffer 345 and the reference voltage VR is provided at the reference node NB.

Also, according to another example embodiment, the first control signal OSCU and the second control signal OSCD may be controlled based on a comparison result between the output node NA and the reference node NB at an initialization time of the amplifier circuit.

Figure 7:
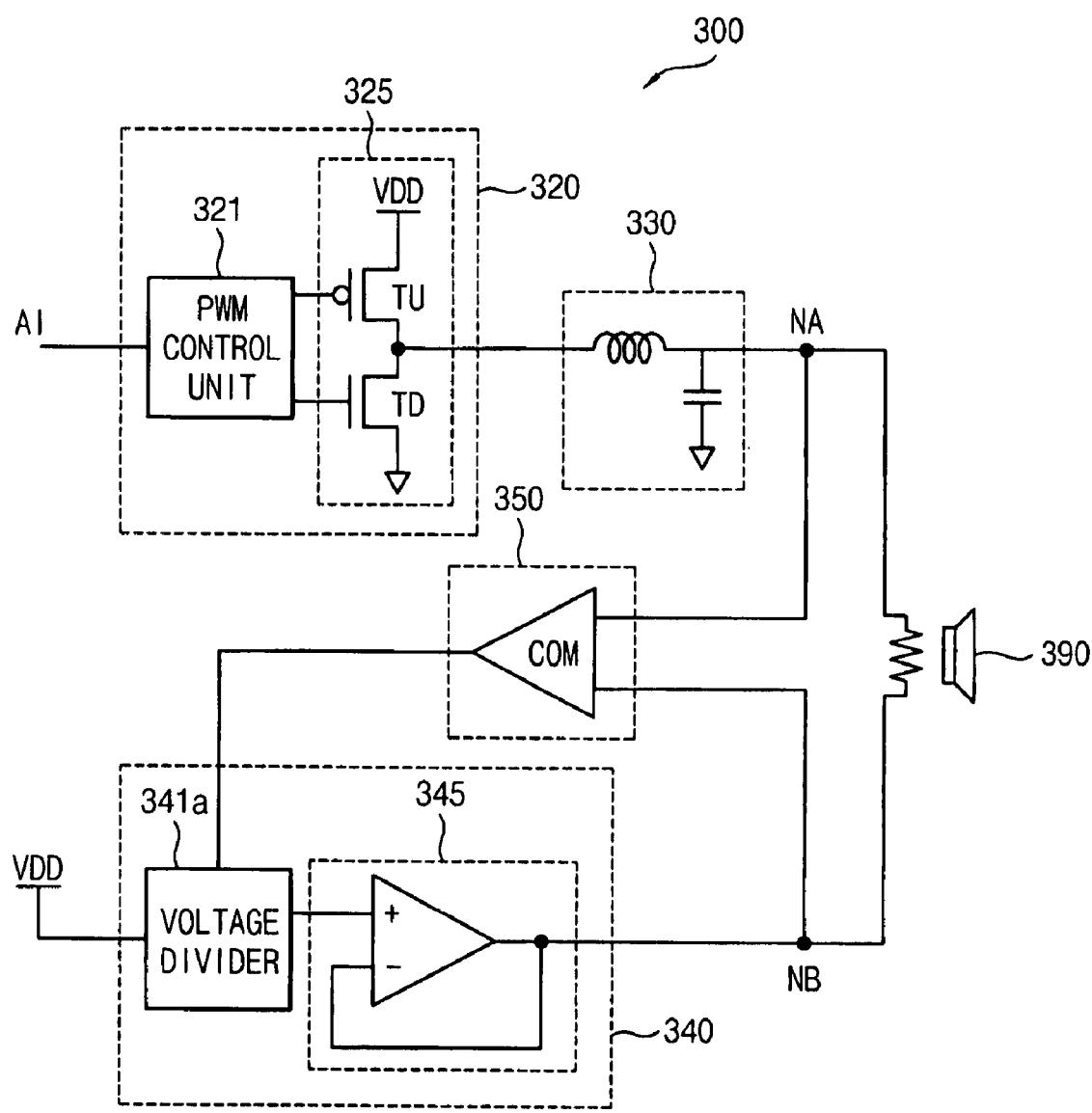
FIG. 7 illustrates an example embodiment of an amplifier circuit in which a voltage divider voltage output by a voltage divider is controlled based on a comparison result between an output node and reference node of the amplifier at an initialization time.
Figure 8:
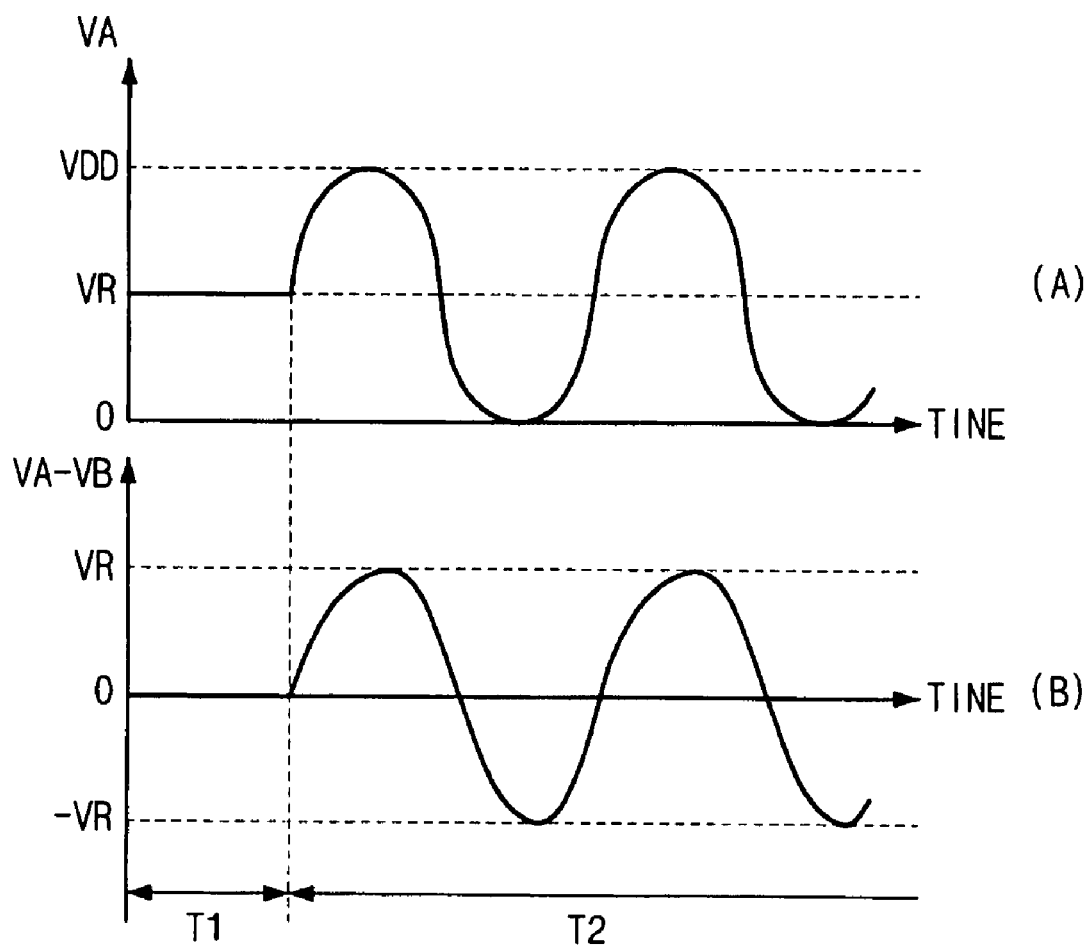
FIGS. 8A and 8B are example diagrams illustrating the operation of an example embodiment of an amplifier circuit.

FIG. 7 illustrates an example configuration of an amplifier circuit 300 in which the voltage divider voltage VV output by the voltage divider 341 is controlled based on a comparison result between the output node NA and the reference node NB determined at an initialization time. In addition to the components of the amplifier circuit 300 previously described with respect to FIG. 6, the amplifier circuit 300 shown in FIG. 7 includes an offset detector 350. The offset detector 350 detects a difference between a reference voltage provided to the one or more speakers 390 via reference node NB and a DC voltage of the output signal provided to the one or more speakers 390 via output node NA (input node of the one or more speakers 390). The example configuration of the offset detector 350 in FIG. 7 includes a comparator COM. In particular, a first input of the comparator COM is connected to the output node NA of the amplifier circuit 300, and a second input of the comparator COM is connected to the reference node NB. The output of the comparator is provided to voltage divider 341. As such, the voltage divider 341 controls the voltage divider voltage VV of the voltage divider based on the output of the offset detector 350.

During a non-mute state of the amplifier circuit 300, the output signal of the amplifier circuit 300 fluctuates to represent the audio input signal AI, and the comparator COM may be deactivated. However, during a mute state of the amplifier circuit 300, the comparator COM is activated and detects the difference between the reference voltage VR at the reference node NB and a DC voltage component output at the output node NA of the amplifier circuit 300. The mute state of the amplifier circuit 300 may correspond to an initialization time.

An offset control signal corresponding to the voltage difference detected during the mute state may be used by the reference voltage generator 340 to control the reference voltage VR. The offset control signal may be used to generate the first control signal OSCU and the second control signal OSCD, thereby controlling the resistance values of the variable resistors RU and RD included in the voltage divider 341. For example, the first control signal OSCU and the second control signal OSCD generated based on the offset control signal may be used to ensure that the reference voltage VR is equal to the DC component of the output signal. The DC component of the output signal during the non-mute state corresponds to the value of the output signal when the amplifier circuit 300 is in a mute state. Stated differently, the resistance values of the variable resistors may be controlled to achieve a difference between the DC voltage component provided at the output node NA of the amplifier circuit 300 and the reference voltage VR provided at the reference node NB that is about 0 volts.

FIGS. 8A and 8B are example diagrams illustrating the operation of the amplifier circuit 300. In FIGS. 8A and 8B, a time period T1 represents a time duration in which the amplifier circuit 300 is in the mute state, and a time period T2 represents a time duration in which the amplifier circuit 300 is in a non-mute state and the one or more speakers are being driven according to the output signal.

Referring to FIG. 8A, a high voltage value of the output signal is VDD and a low voltage value of the output signal is 0. In FIG. 8A, the reference voltage VR is VDD/2. FIG. 8B illustrates a resultant voltage signal obtained by subtracting the reference voltage applied to the reference node NB from the output signal applied to the output node NA. As such, the one or more speaker 390 having a resistance RL are being driven during the time duration T2 by an output signal having a voltage varying between VR and −VR according to an example embodiment.

Figure 9:
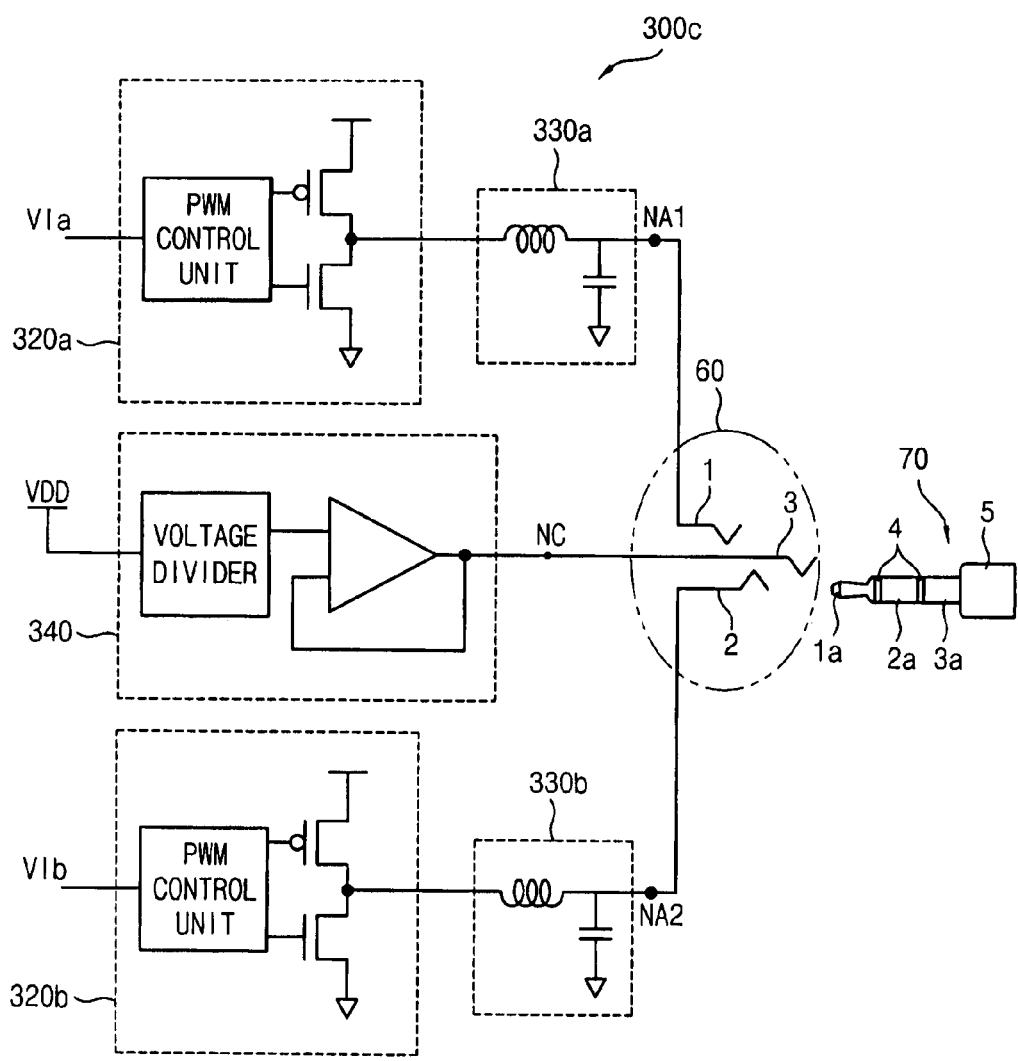
FIG. 9 illustrates an example embodiment of an amplifier circuit configured to be connected to a three-port connector.

FIG. 9 illustrates still another example embodiment of an amplifier circuit 300 configured to be connected to a three-port connector 60. As shown in FIG. 9, an example embodiment of a reference voltage generator 340 is configured to provide a reference voltage VR to a common reference node NC, which is used as a reference node for more than one PWM driving circuit and low-pass filter combination.

Referring to FIG. 9, the three-port connector 60 includes a first terminal 1, a second terminal 2 and a third terminal 3. A first PWM driving circuit 320*a* receives a first audio input signal AIa and provides a first amplified PWM driving signal to a first low-pass filter 330*a*. The first low-pass filter 330*a* filters the first amplified PWM driving signal and provides the filtered signal to a first output node NA1 connected to the first terminal 1 of the three-port connector 60. A second PWM driving circuit 320*b* receives a second audio input signal AIb and provides a second amplified PWM driving signal to a second low-pass filter 330*b*. The low-pass filter 33*b* filters the second amplified PWM driving signal and provides the filtered signal to a second output node NA2 connected to the second terminal 2 of the three-port connector 60. In FIG. 9, the reference voltage generator 340 provides a reference voltage to the common reference node NC connected to the third terminal 3 of the connector 60.

The configuration of the first PWM driving circuit 320*a* and the second PWM driving circuit 320*b* are each similar, or the same, as the PWM driving circuit 320 described with respect to FIG. 5. Further, the configuration of the first low-pass filter 330*a* and the second low-pass filter 330*b* are each similar, or the same, as the low-pass filter 330 described with respect to FIG. 5. Still further, as indicated by the common reference number, the reference voltage generator 340 illustrated in FIG. 9 is the same as the reference voltage generator previously described with reference to FIG. 5.

However, it should be appreciated that an input signal and/or source of the input signal received by each of the first PWM driving circuit 320*a* and the second PWM driving circuit 320*b* may be different. Because the input signal and/or source of the input signal received by each of the first PWM driving circuit 320*a* and the second PWM driving circuit 320*b* may be different, one or more component values of the first PWM driving circuit 320*a*, the second driving circuit 320*b*, the first low-pass filter 330*a* and/or the second low-pass filter 330*b* may be tailored to the input signal and/or source of the input signal. For example, an operating threshold of the first low-pass filter 330*a* may be different from an operating threshold of the second low-pass filter 330*b* because of differences between the input signal input to the first PWM driving circuit 320*a* and the input signal input to the second PWM driving circuit 320*b*. In this case, the capacitance and/or inductance values of the first low-pass filter 330*a* are different from the capacitance and/or inductance values of the second low-pass filter 330*b*.

The three-port connector 60 is configured to receive a connector plug 70. The three-port connector plug 70 includes a first terminal 1*a* configured to be connected to the first terminal of the three-port connector 60; a second terminal 2*a* configured to be connected to the second terminal 2 of the three-port connector 60; a third terminal 3*a* configured to be connected to the third terminal 3 of the three-port connector 60; insulators 4 separating the first terminal 1*a*, the second terminal 2*a* and the third terminal 3*a*; and a body 5.

Referring to FIG. 9, various external devices can be connected to the amplifier circuit 300*c*. The various external devices may be headphone speakers, stereo speakers, recording devices, etc.

Further, one skilled in the art will appreciate that while the example embodiment of the amplifier circuit 300*c* is not shown as including offset detectors 350, offset detectors 350 could be incorporated into the example embodiment of the amplifier circuit 300*c* without departing from the teachings of the example embodiments described in this specification.

Figure 10:
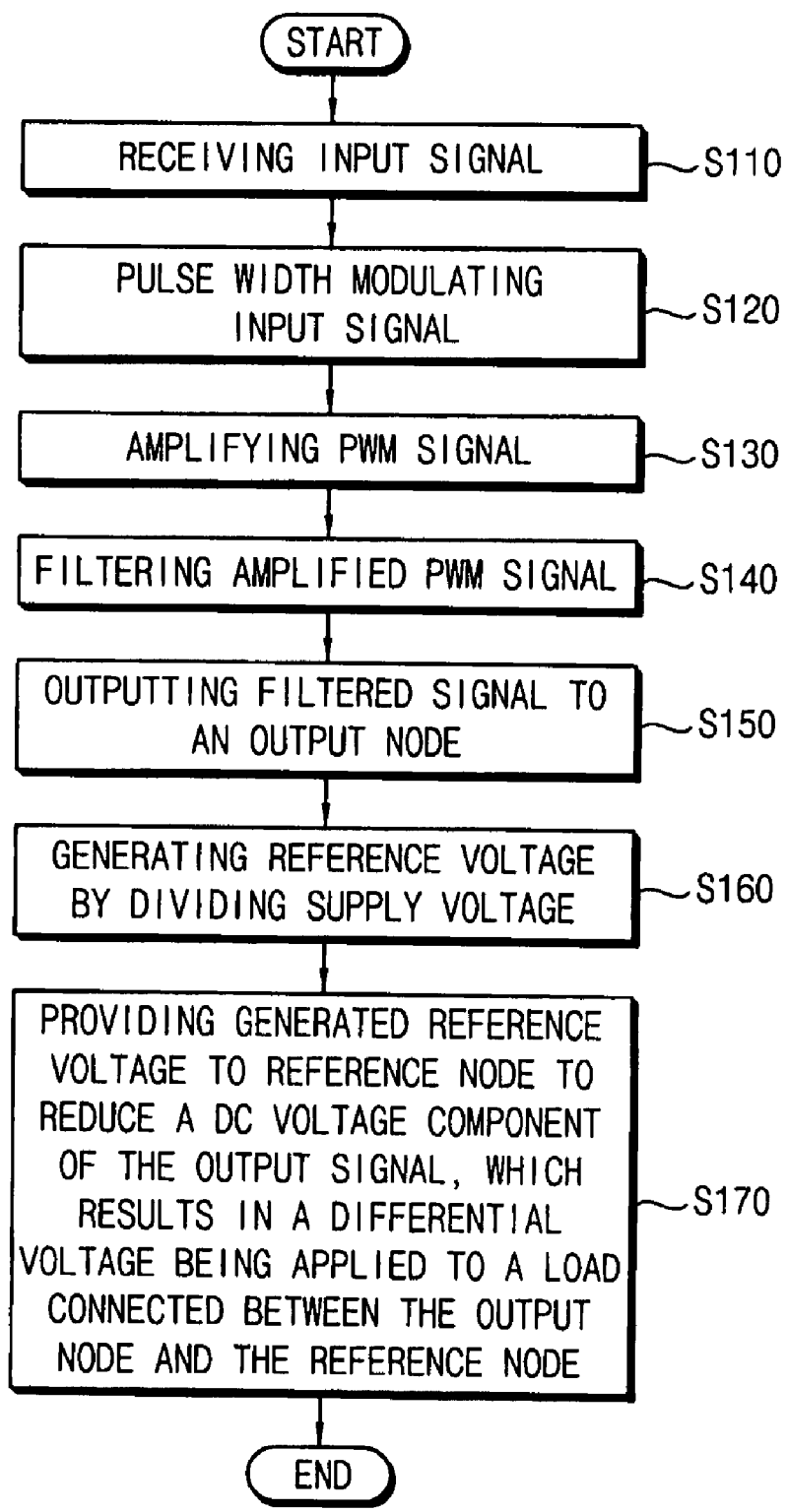
FIG. 10 is an example embodiment of a method of reducing a DC component of an amplified PWM signal applied to an output node of an amplifier circuit.

FIG. 10 is an example embodiment of a method of reducing a DC component of an amplified PWM signal of an output node.

Referring to FIG. 10, the method includes receiving an audio input signal in step S110, pulse width modulating the received input signal in step S120, and amplifying the PWM signal in step S130. For example, an audio input signal received by the PWM driving circuit 320 is pulse width modulated and amplified by the PWM driving circuit 320 as previously described.

As shown in FIG. 10, the method also includes filtering the amplified PWM signal in step S1140 and outputting the filtered signal to an output node in step S150. For example, the low-pass filter 330 receives the amplified signal from the PWM driving circuit 320, filters the amplified signal and provides the filtered signal to the output node NA.

Still referring to FIG. 10, the method includes generating a reference voltage by dividing a supply voltage in step S160. For example, the reference voltage generator 340 divides the supply voltage to generate a reference voltage that is a median value between a high voltage value and a low voltage value of the output signal. As such, if the high voltage value of the output signal is about 5 volts and the low value of the output signal is about 0 volts, the reference voltage will be about 2.5 volts.

Still referring to FIG. 10, the generated reference voltage is provided, in step S170, to a reference node to reduce a DC voltage component of the output signal, which results in a differential voltage being applied to a load connected between the output node and the reference node. For example, the reference voltage generator 340 provides the reference voltage to the reference node NB and thus, one or more speakers connected between the output node NA and the reference node NB receives a differential voltage.

One skilled in the art will appreciate that operations in steps S160 and S170, which may be performed by the reference voltage generator 340, may be performed substantially concurrently with operations in steps S110-S150, which may be performed by the PWM driving circuit 320 and the low-pass filter 330.

Figure 11:
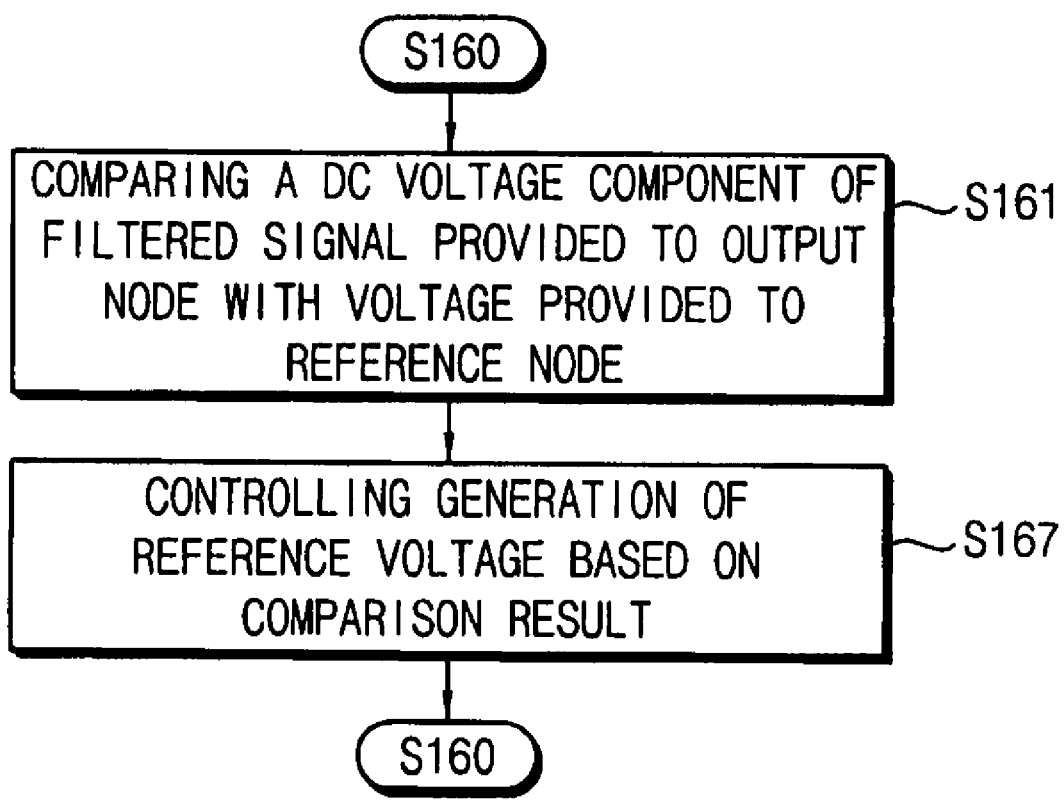
FIG. 11 illustrates another example embodiment of a method of reducing a DC component of an amplified PWM signal applied to an output node of an amplifier circuit.

FIG. 11 illustrates another example embodiment of a method of reducing a DC component of an amplified PWM signal of an output node. The example embodiment of FIG. 11 includes the operations described with respect to the example embodiment illustrated in FIG. 10; and thus, only the new operations are described below for the sake of brevity.

Referring to FIG. 11, the method includes comparing a DC voltage component of a filtered signal provided to an output node with a voltage provided to a reference node in step S161 and controlling the generation of the reference voltage, in step S167, based on the comparison result. For example, the offset detector 350 compares the DC voltage component of the filtered signal provided to the output node NA with the reference voltage provided to the reference node NB. The difference between the DC voltage component of the filtered signal and the reference voltage should be zero according to an example embodiment. As such, a comparison result from the offset detector 350 is provided to the voltage divider 341 to control the generation of the reference voltage so that the difference between the DC voltage component of the filtered signal and the reference voltage is about zero. For example, the comparison result of the offset detect may be used to control the first control signal OSCU and the second control signal OSCD.

While this invention has been particularly shown and described with reference to example embodiments of the present invention, it will be understood by those skilled in the art that various changes in form and details may be made therein without departing from the spirit and scope of the invention.

What is claimed is:

1. A digital amplifier comprising:
   a pulse width modulation signal generator receiving an input signal and generating an amplified pulse width modulated signal;
   a filter filtering the amplified pulse width modulated signal and providing the filtered amplified pulse width modulated signal to an input node of a load; and
   a reference voltage generator providing a reference voltage to a reference node of the load to reduce a DC component of the filtered amplified pulse width modulated signal, the reference voltage is substantially equal to one half of a sum of a maximum voltage value and a minimum voltage value of the filtered amplified pulse width modulated signal,
   wherein the reference voltage generator includes,
      a voltage divider dividing a supply voltage to provide a voltage divider voltage; and
      an analog buffer buffering the voltage divider voltage to provide a reference voltage to the reference node of the load.

2. The digital amplifier of claim 1, wherein there is no coupling capacitor between the filter and the input node of the load.

3. The digital amplifier of claim 1, wherein the filtered amplified pulse width modulation signal is provided directly from the filter to the input node of the load.

4. The digital amplifier of claim 1, wherein the reference voltage generator is not a charge pump.

5. The digital amplifier of claim 1, wherein the pulse width modulation signal generator includes:
   a pulse width modulation circuit receiving the input signal and providing a pulse width modulated signal; and
   a driving circuit amplifying the pulse width modulation signal.

6. The digital amplifier of claim 1, further comprising:
   a comparator comparing an input node voltage of the load and a reference node voltage of the load and providing a comparison result to the reference voltage generator,
   wherein the voltage divider uses the comparison result to obtain the voltage divider voltage.

7. The digital amplifier of claim 1, wherein voltage divider includes variable resistors varied based on control signals generated from information stored in a register and divides the supply voltage based on the control signals.

8. The digital amplifier of claim 1, wherein the filter includes a low-pass filter.

9. The digital amplifier of claim 1, wherein the load includes at least one speaker.

10. A digital amplifier comprising:
    a pulse width modulation circuit receiving an input signal and providing a pulse width modulated signal corresponding to the input signal;
    a filter filtering the pulse width modulated signal and providing the filtered pulse modulated signal directly to an input node of a load; and
    a reference voltage generator providing a reference voltage directly to a reference node of the load to reduce a DC component of the filtered pulse width modulation signal,
    wherein the reference voltage generator includes,
       a voltage divider dividing a supply voltage to provide a voltage divider voltage; and
       an analog buffer buffering the voltage divider voltage to provide a reference voltage to the reference node of the load.

11. A digital amplifier comprising:
    a pulse width modulation signal generator receiving an input signal and generating an amplified pulse width modulated signal;
    a filter filtering the amplified pulse width modulated signal and providing the filtered amplified pulse width modulated signal to an input node of a load; and
    a reference voltage generator providing a reference voltage that is substantially constant and greater than zero to a reference node of the load to reduce a DC component of the amplified pulse modulation signal provided to the input node of the load,
    wherein the reference voltage generator includes,
       a voltage divider dividing a supply voltage to provide a voltage divider voltage; and
       an analog buffer buffering the voltage divider voltage to provide a reference voltage to the reference node of the load.

12. A reference voltage generator for reducing a DC component of an amplified pulse width modulated signal of a digital amplifier, comprising:
    a voltage divider receiving a voltage and dividing the voltage to provide a voltage divider voltage that is based on variation of the amplified pulse width modulated signal provided to an input node of a load; and
    an analog buffer buffering the voltage divider voltage to provide a reference voltage to a reference node of the load to reduce a DC component of the amplified pulse width modulated signal provided to the input node of the load.

13. A method of reducing a DC component of an amplified pulse width modulated signal applied to an input node of a load:
    dividing a supply voltage to provide a voltage divider voltage;
    buffering the voltage divider voltage to generate a reference voltage that is substantially equal to one half of a sum of a maximum voltage value and a minimum voltage value of the amplified pulse width modulated signal; and
    providing the reference voltage to a reference node of the load to reduce a DC component of the amplified pulse width modulated signal.

14. The method of claim 13, further comprising:
    pulse width modulating a received signal to generate a pulse width modulated signal;
    amplifying the pulse width modulated signal; and
    filtering the amplified pulse width modulated signal.

15. The method of claim 13, further comprising:
    comparing an input node voltage with a reference node voltage; and
    controlling the division of the supply voltage based on the comparison.

16. The method of claim 13, wherein the reference voltage is greater than zero.

17. A digital amplifier comprising:
    a pulse width modulation signal generator receiving an input signal and generating an amplified pulse width modulated signal;
    a filter filtering the amplified pulse width modulated signal and providing the filtered amplified pulse width modulated signal to an input node of a load; and a reference voltage generator providing a reference voltage to a reference node of the load to reduce a DC component of the filtered amplified pulse width modulated signal, the reference voltage corresponding to an average voltage of the filtered amplified pulse width modulated signal, wherein the reference voltage generator includes, a voltage divider dividing a supply voltage to provide a voltage divider voltage; and an analog buffer buffering the voltage divider voltage to provide a reference voltage to the reference node of the load.

* * * * *